(12) United States Patent
Thomas et al.

(10) Patent No.: US 10,870,400 B2
(45) Date of Patent: Dec. 22, 2020

(54) TEST SYSTEM FOR VERIFICATION OF FRONT CAMERA LIGHTING FEATURES

(71) Applicant: Magna Electronics Inc., Auburn Hills, MI (US)

(72) Inventors: Arun Thomas, Rochester Hills, MI (US); Jeffrey Ropponen, Rochester Hills, MI (US); Shreyas C. Nagaraj, Farmington Hills, MI (US); Thirumal Siruvole, Auburn Hills, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 60 days.

(21) Appl. No.: 16/203,061

(22) Filed: Nov. 28, 2018

(65) Prior Publication Data

US 2019/0168685 A1 Jun. 6, 2019

Related U.S. Application Data

(60) Provisional application No. 62/595,168, filed on Dec. 6, 2017.

(51) Int. Cl.
*B60R 11/04* (2006.01)
*B60R 11/02* (2006.01)
(Continued)

(52) U.S. Cl.
CPC .............. *B60R 11/04* (2013.01); *B60R 1/12* (2013.01); *B60R 1/1207* (2013.01);
(Continued)

(58) Field of Classification Search
CPC ......... B60R 11/04; B60R 1/12; B60R 1/1207; B60R 11/0235; B60R 2001/1215;
(Continued)

(56) References Cited

U.S. PATENT DOCUMENTS 5,550,677 A 8/1996 Schofield et al.
5,670,935 A 9/1997 Schofield et al.
(Continued)

FOREIGN PATENT DOCUMENTS

JP 2006227531 A * 8/2006

OTHER PUBLICATIONS

Teiichiro Takano, Projector for Surveillance Camera, JP-2006227531-A, Aug. 31, 2006 (Year: 2006).*

*Primary Examiner* — Hunter B Lonsberry
*Assistant Examiner* — Elizabeth Yang
(74) *Attorney, Agent, or Firm* — Honigman LLP

(57) ABSTRACT

A method of testing a vehicular camera includes providing a camera that has a field of view, providing a display screen that displays video images, providing an LED matrix having a plurality of LEDs that emit patterns of light of different colors, and providing a partially light reflecting and partially light transmitting mirror in the field of view of the camera and between the camera and the display screen or between the camera and the LED matrix. A simulator control generates video control signals and LED control signals. Displayed video images either pass through the mirror or reflect off the mirror to be imaged by the camera. The emitted patterns of light either reflect off the mirror or pass through the mirror to be imaged by the camera. A processor may process captured image data to determine whether or not the camera is functioning properly.

20 Claims, 2 Drawing Sheets

(51) Int. Cl.
  *B60R 1/12* (2006.01)
  *G01R 31/00* (2006.01)
  *H05B 45/10* (2020.01)
  *H05B 45/20* (2020.01)
(52) U.S. Cl.
  CPC ........ *B60R 11/0235* (2013.01); *G01R 31/007* (2013.01); *H05B 45/10* (2020.01); *H05B 45/20* (2020.01); *B60R 2001/1215* (2013.01); *B60R 2001/1253* (2013.01)
(58) Field of Classification Search
  CPC ............ B60R 2001/1253; H05B 45/20; H05B 45/10; G01R 31/007
  See application file for complete search history.

(56) References Cited

U.S. PATENT DOCUMENTS

| | | |
|---|---|---|
| 5,949,331 A | 9/1999 | Schofield et al. |
| 7,038,577 B2 | 5/2006 | Pawlicki et al. |
| 7,720,580 B2 | 5/2010 | Higgins-Luthman |
| 7,855,755 B2 | 12/2010 | Weller et al. |
| 2002/0110266 A1* | 8/2002 | Teng ................... G06K 9/00046 382/127 |
| 2004/0184033 A1* | 9/2004 | Nelson ................. G01J 3/2823 356/302 |
| 2005/0089208 A1 | 4/2005 | Dong et al. |
| 2007/0211240 A1 | 9/2007 | Matsumoto et al. |
| 2008/0068520 A1* | 3/2008 | Minikey, Jr. ............... B60R 1/12 349/11 |
| 2012/0196252 A1* | 8/2012 | Jensen ..................... G09B 9/04 434/62 |
| 2013/0038736 A1* | 2/2013 | Yamamura .............. F21S 41/36 348/148 |
| 2015/0212294 A1* | 7/2015 | Imamura ................ G03B 13/36 348/345 |
| 2017/0006282 A1 | 1/2017 | Sigle |
| 2017/0234923 A1 | 8/2017 | Douglas et al. |
| 2018/0302615 A1 | 10/2018 | Lehmann et al. |
| 2018/0373944 A1 | 12/2018 | Sesti et al. |

* cited by examiner

TEST SYSTEM FOR VERIFICATION OF FRONT CAMERA LIGHTING FEATURES

CROSS REFERENCE TO RELATED APPLICATION

The present application claims the filing benefits of U.S. provisional application Ser. No. 62/595,168, filed Dec. 6, 2017, which is hereby incorporated herein by reference in its entirety.

FIELD OF THE INVENTION

The present invention relates generally to a vehicle vision system for a vehicle and, more particularly, to test systems for cameras for a vehicle vision system.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties.

SUMMARY OF THE INVENTION

The present invention provides a testing system for a camera for a driver assistance system or vision system or imaging system for a vehicle. The testing system or method simulates automotive and environmental lighting at a bench/lab level for front camera module (FCM) testing. The system uses a display screen and a LED matrix to provide the desired video images and lighting characteristics (e.g., pattern, intensity and color) representative of vehicle headlights and vehicle taillights and traffic lights and street lights.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system operates to capture image data representative of scenes exterior of the vehicle and may process the captured image data to display images and/or to detect objects at or near the vehicle and in the predicted path of the vehicle, such as for maneuvering the vehicle autonomously or for assisting a driver of the vehicle in maneuvering the vehicle. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
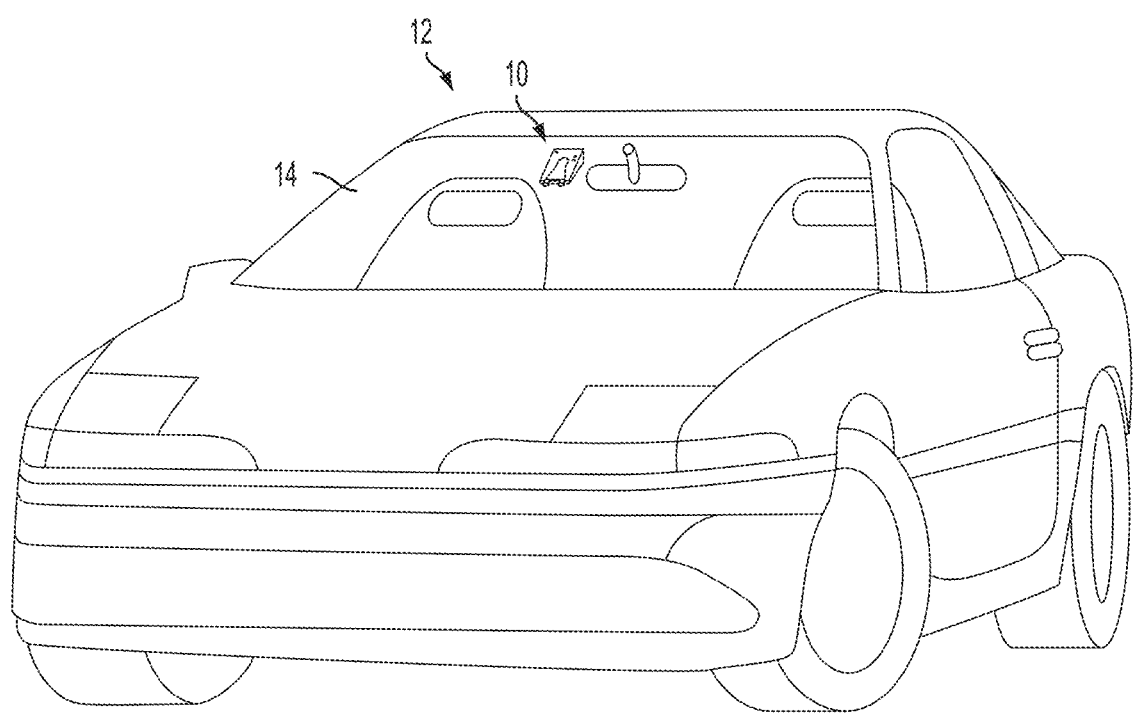
FIG. 1 is a perspective view of a vehicle with a vision system that incorporates at least a forward camera module.

Referring now to the drawings and the illustrative embodiments depicted therein, vision system 10 for a vehicle 12 includes at least one exterior viewing imaging sensor or camera, such as a forward viewing imaging sensor or camera (or forward camera module or FCM), which may be disposed at and behind the windshield 14 of the vehicle and viewing forward through the windshield so as to capture image data representative of the scene occurring forward of the vehicle (FIG. 1). Optionally, the system may include multiple exterior viewing imaging sensors or cameras, such as a forward viewing camera at the front of the vehicle, and a sideward/rearward viewing camera at respective sides of the vehicle, and a rearview viewing camera at the rear of the vehicle, which capture images exterior of the vehicle. The camera or cameras each include a lens for focusing images at or onto an imaging array or imaging plane or imager of the camera. Optionally, the forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 10 includes a control or electronic control unit (ECU) or processor that is operable to process image data captured by the camera or cameras and may detect objects or the like and/or provide displayed images at a display device for viewing by the driver of the vehicle. The data transfer or signal communication from the camera to the ECU may comprise any suitable data or communication link, such as a vehicle network bus or the like of the equipped vehicle.

The system or method of the present invention simulates automotive and environmental lighting that can be used for testing FCM lighting features in a lab. The FCM is used in automotive applications, and is a camera module that is mounted at and behind the front windshield of the vehicle such that the camera views through the windshield and forward of the vehicle. The functions of the FCM (via processing of image data captured by the camera of the FCM) are to detect various objects such as vehicles, lane markers, oncoming vehicle headlights, leading vehicle brake/tail lights, indicators of other vehicles, pedestrians, and the like.

Figure 2:
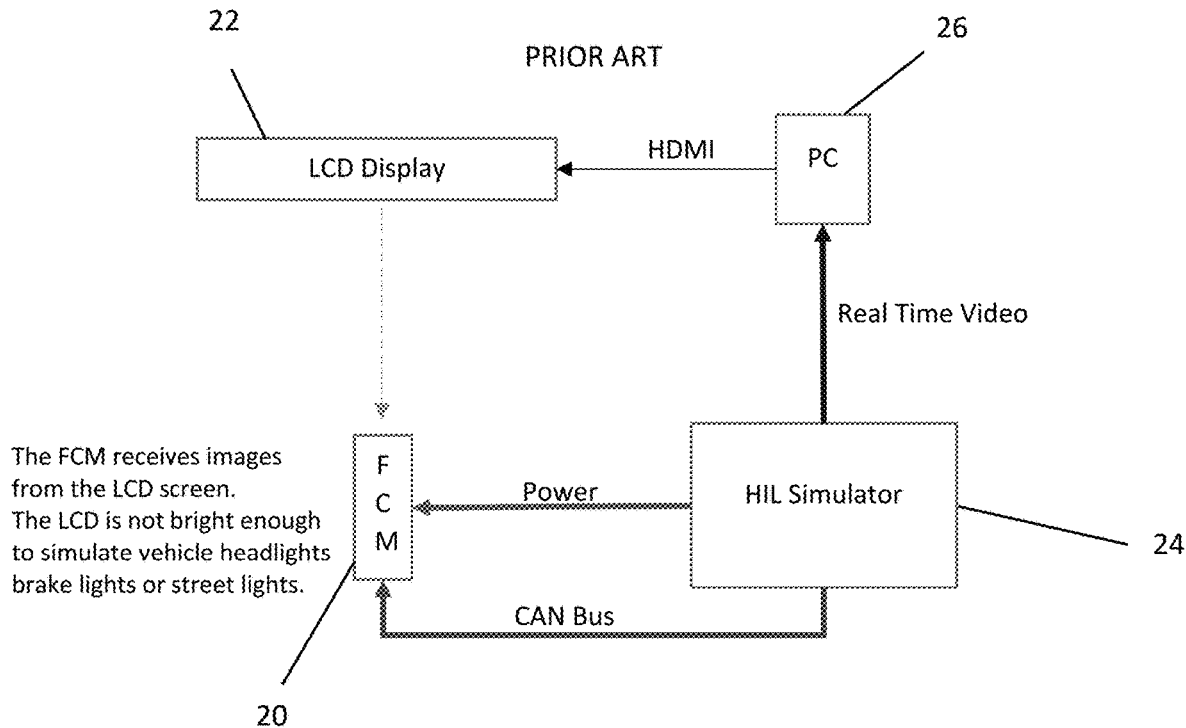
FIG. 2 is a block diagram of a known test system.

As shown in FIG. 2, a test setup typically includes a test fixture that comprises of the FCM 20 mounted in front of a LCD display 22 (such as, for example, a PC monitor, such as a large PC monitor of, for example, 26 inches diagonal dimension). A video with the test scenario is played back on the LCD display 22. The FCM 20 is powered by a hardware-in-the-loop (HIL) simulator 24. The HIL simulator 24 includes a Controller Area Network (CAN) controller that communicates CAN messages to and from the FCM 20. These CAN messages simulate messages that occur during operation and that are required for functioning of the FCM 20. A personal computer 26 or other processing device may transmit the test scenario video received from the HIL simulator 24 to the display 22 (e.g., via High-Definition Multimedia Interface (HDMI)).

With such a test setup it is typically not possible to simulate, for example, vehicle headlights of oncoming traffic or tail lights of leading vehicles or street lights. This is because the LCD screen or monitor is not bright enough to simulate the lights from various sources such as those.

Figure 3:
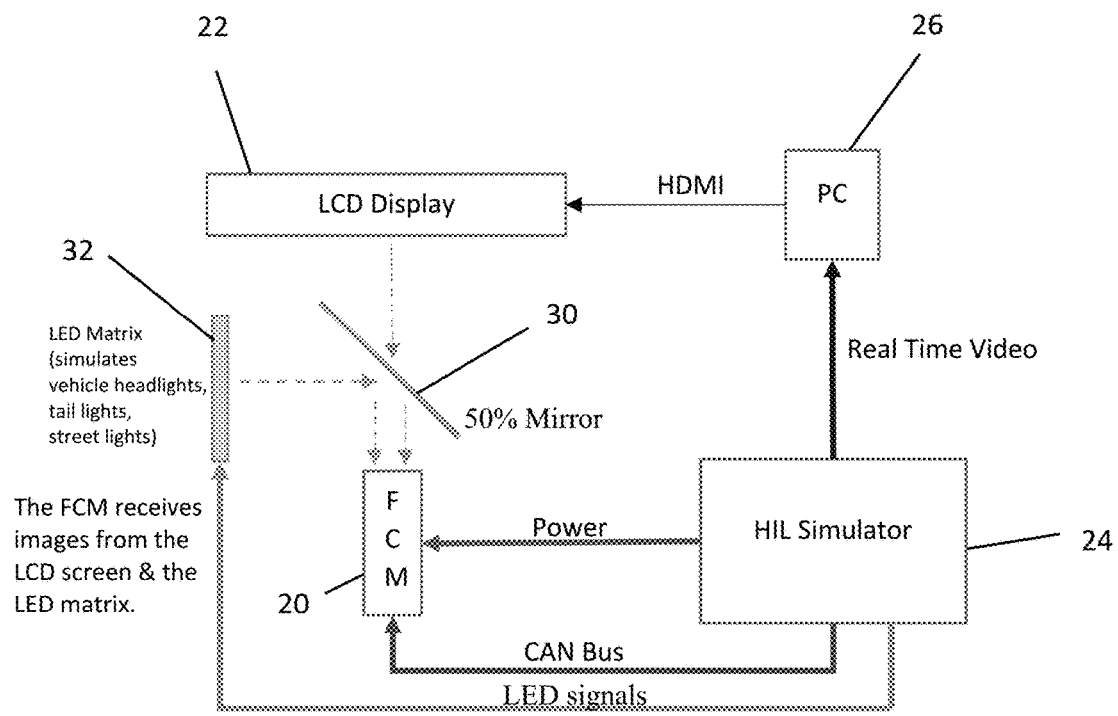
FIG. 3 is a block diagram of the test system of the present invention.

The test setup of the present invention (see FIG. 3) comprises a partially reflective mirror 30 (e.g., a 50 percent mirror—that is, 50 percent of light incident thereon is reflected by the mirror and 50 percent of light incident thereon is transmitted through the mirror) placed at an angle (e.g., 45 degrees) with respect to the LCD screen 22. A light emitting diode (LED) matrix 32 is placed perpendicular to the LCD screen 22. The LED matrix 32 comprises, for example, 1024 multicolor LEDs placed at a distance of, for example, 5 mm from each other in a square format (32 width by 32 length). The color and status (on or off) of the LEDs are controlled by the HIL simulator 24 and represent the various types of light sources that are bring displayed on the LCD screen 22. When the LCD display 22 emits light, some of the light will pass through the mirror 30 and be received by the FCM 20. Likewise, when the LED matrix 32 emits light, some of the light will reflect off the mirror 30 and be received by the FMC 20. In this way, the FMC 20 may receive light emitted by both the LCD display 22 and the LED matrix 32 simultaneously. The LED matrix 32 is capable of generating lights bright enough to simulate various sources (e.g., headlights) seen during driving.

With this setup, all of the different lighting features of the FCM 20 can be tested at a bench level. With the known prior setup, it was not possible to be test the lighting features of the FCM 20 at a bench/lab level. All of the testing had to be performed in-vehicle and while driving the vehicle during night time conditions. This is very tedious, time consuming and expensive, since testing has to be performed for every software release of the FCM 20. It is also not possible, with the known prior setup, to recreate scenarios in case a failure is found. With the test setup of the present invention, the HIL 24 can be programmed to run several tests in an automated manner thus resulting in further savings.

Thus, the test setup and system and method of the present invention provides an LED matrix that is capable of outputting high intensity light of different colors to simulate headlamps, taillights, street lights and the like. The LED matrix receives a control signal from an HIL simulator, which causes the LED matrix to energize selected ones of the LEDs to emit light representative of or similar to headlamps, taillights, street lights and/or the like. The FCM captures image data while the LED matrix is emitting the different light patterns/colors and the image data is processed to determine whether or not the FCM is functioning properly.

In the illustrated embodiment, the LED matrix is arranged perpendicular to the LCD display, and a 50 percent mirror is set at a 45 degree angle, such that light emitted by the LED matrix reflects off of the mirror and toward the FCM. Light emitted by the LCD display passes through the 50 percent mirror and is received at the FCM. The 50 percent mirror reflects light incident at one surface (the surface partially facing toward the LED matrix) and is transmissive of light incident at the other surface (the surface partially facing toward the LCD display). Although the LED matrix is shown offset from the FCM and the LCD display is shown in front of the imager of the FCM, the test system may have the LED matrix disposed in front of the imager (whereby the light emitted by the LED matrix passes through the 50 percent, angled mirror) and the LCD display disposed offset from the FCM (whereby the images emitted by the LCD display reflect off of the mirror so as to be directed toward and received at the imager of the FCM), while remaining within the spirit and scope of the present invention.

Thus, the system displays various images or patterns at the LCD display (via a PC that receives signals (such as video signals) from the HIL simulator), while the LED matrix emits light (simulating vehicle headlights, vehicle taillights, street lights and/or the like) responsive to signals from the HIL simulator. The FCM captures image data of the images emitted by the LED display screen and of the images emitted by the LED matrix, whereby the captured image data is processed to determine whether or not the FCM is functioning properly. Prior known bench test setups could not simultaneously display a traffic scenario with accurate simulation of moving or stationary lights.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ™ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ladar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least 1 million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978;

7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in International Publication Nos. WO 2010/144900; WO 2013/043661 and/or WO 2013/081985, and/or U.S. Pat. No. 9,126,525, which are hereby incorporated herein by reference in their entireties.

Optionally, the vision system may include a display for displaying images captured by one or more of the imaging sensors for viewing by the driver of the vehicle while the driver is normally operating the vehicle. Optionally, for example, the vision system may include a video display device, such as by utilizing aspects of the video display systems described in U.S. Pat. Nos. 5,530,240; 6,329,925; 7,855,755; 7,626,749; 7,581,859; 7,446,650; 7,338,177; 7,274,501; 7,255,451; 7,195,381; 7,184,190; 5,668,663; 5,724,187; 6,690,268; 7,370,983; 7,329,013; 7,308,341; 7,289,037; 7,249,860; 7,004,593; 4,546,551; 5,699,044; 4,953,305; 5,576,687; 5,632,092; 5,708,410; 5,737,226; 5,802,727; 5,878,370; 6,087,953; 6,173,501; 6,222,460; 6,513,252 and/or 6,642,851, and/or U.S. Publication Nos. US-2014-0022390; US-2012-0162427; US-2006-0050018 and/or US-2006-0061008, which are all hereby incorporated herein by reference in their entireties. Optionally, the vision system (utilizing the forward viewing camera and a rearward viewing camera and other cameras disposed at the vehicle with exterior fields of view) may be part of or may provide a display of a top-down view or bird's-eye view system of the vehicle or a surround view at the vehicle, such as by utilizing aspects of the vision systems described in International Publication Nos. WO 2010/099416; WO 2011/028686; WO 2012/075250; WO 2013/019795; WO 2012/075250; WO 2012/145822; WO 2013/081985; WO 2013/086249 and/or WO 2013/109869, and/or U.S. Publication No. US-2012-0162427, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A method of testing a vehicular camera for a vehicular vision system, the method comprising:

providing a vehicular camera suitable for use on a vehicle, wherein the vehicular camera has a field of view;

providing a display screen that displays video images;

providing a light emitting diode (LED) matrix comprising a plurality of LEDs operable to emit patterns of light of different colors;

providing a partially light reflecting and partially light transmitting mirror;

positioning the vehicular camera at a structure;

positioning the display screen in the field of view of the vehicular camera;

positioning the mirror in the field of view of the vehicular camera between the vehicular camera and the display screen;

positioning the LED matrix in the field of view of the vehicular camera as viewed as a reflection off the mirror;

providing a simulator control that generates video control signals and LED control signals;

responsive to video control signals, displaying video images via the display screen;

responsive to LED control signals, emitting patterns of light via the LED matrix;

wherein the displayed video images are imaged by the vehicular camera through the mirror;

wherein the emitted patterns of light reflect off the mirror and are imaged by the vehicular camera; and capturing image data with the vehicular camera, wherein the captured image data is representative of the displayed video images and the emitted patterns of light imaged by the vehicular camera.

2. The method of claim 1, wherein the patterns of light emitted by the LED matrix are representative of vehicle headlights and/or vehicle taillights.

3. The method of claim 1, wherein the mirror is angled at 45 degrees relative to an image plane of the vehicular camera, and wherein a display plane of the display screen is parallel to the image plane, and wherein an LED plane of the LED matrix is perpendicular to the image plane.

4. The method of claim 1, wherein the display screen comprises a liquid crystal display screen.

5. The method of claim 1, comprising providing a computer, wherein the video control signals generated by the simulator control are received at the computer, and wherein the computer controls the display screen responsive to the received video control signals.

6. The method of claim 1, wherein the partially light reflecting and partially light transmitting mirror reflects 50 percent of light incident thereon and transmits 50 percent of light incident thereon.

7. The method of claim 1, wherein image data captured by the vehicular camera is processed at a processor to determine whether or not the vehicular camera is functioning properly.

8. The method of claim 1, wherein the simulator control provides vehicular camera operational data via a controller area network (CAN).

9. The method of claim 1, wherein the vehicular camera comprises a forward camera module configured to mount at a vehicle so as to have a field of view forward of the vehicle.

10. A method of testing a vehicular camera for a vehicular vision system, the method comprising:

providing a vehicular camera suitable for use on a vehicle, wherein the vehicular camera has a field of view;

providing a display screen that displays video images;

providing a light emitting diode (LED) matrix comprising a plurality of LEDs operable to emit patterns of light of different colors;

providing a partially light reflecting and partially light transmitting mirror;
positioning the vehicular camera at a structure;
positioning the LED matrix in the field of view of the vehicular camera;
positioning the mirror in the field of view of the vehicular camera between the vehicular camera and the LED matrix;
positioning the display screen in the field of view of the vehicular camera as viewed as a reflection off the mirror;
providing a simulator control that generates video control signals and LED control signals;
responsive to video control signals, displaying video images via the display screen;
responsive to LED control signals, emitting patterns of light via the LED matrix;
wherein the emitted patterns of light are imaged by the vehicular camera through the mirror;
wherein the displayed video images reflect off the mirror and are imaged by the vehicular camera; and
capturing image data with the vehicular camera, wherein the captured image data is representative of the displayed video images and the emitted patterns of light imaged by the vehicular camera.

11. The method of claim 10, wherein the mirror is angled at 45 degrees relative to an image plane of the vehicular camera, and wherein a display plane of the display screen is perpendicular to the image plane, and wherein an LED plane of the LED matrix is parallel to the image plane.

12. The method of claim 10, wherein the patterns of light emitted by the LED matrix are representative of vehicle headlights and/or vehicle taillights.

13. The method of claim 10, wherein the display screen comprises a liquid crystal display screen.

14. The method of claim 10, comprising providing a computer, wherein the video control signals generated by the simulator control are received at the computer, and wherein the computer controls the display screen responsive to the received video control signals.

15. The method of claim 10, wherein the partially light reflecting and partially light transmitting mirror reflects 50 percent of light incident thereon and transmits 50 percent of light incident thereon.

16. The method of claim 10, wherein image data captured by the vehicular camera is processed at a processor to determine whether or not the vehicular camera is functioning properly.

17. The method of claim 10, wherein the simulator control provides vehicular camera operational data via a controller area network (CAN).

18. The method of claim 10, wherein the vehicular camera comprises a forward camera module configured to mount at a vehicle so as to have a field of view forward of the vehicle.

19. A method of testing a vehicular camera for a vehicular vision system, the method comprising:
providing a vehicular camera suitable for use on a vehicle, wherein the vehicular camera has a field of view;
providing a display screen that displays video images;
providing a light emitting diode (LED) matrix comprising a plurality of LEDs operable to emit patterns of light of different colors;
providing a partially light reflecting and partially light transmitting mirror;
positioning the vehicular camera at a structure;
positioning the display screen in the field of view of the vehicular camera;
positioning the mirror in the field of view of the vehicular camera between the vehicular camera and the display screen;
positioning the LED matrix in the field of view of the vehicular camera as viewed as a reflection off the mirror;
wherein the mirror is angled at 45 degrees relative to an image plane of the vehicular camera, and wherein a display plane of the display screen is parallel to the image plane, and wherein an LED plane of the LED matrix is perpendicular to the image plane;
providing a simulator control that generates video control signals and LED control signals;
responsive to video control signals, displaying video images via the display screen;
responsive to LED control signals, emitting patterns of light via the LED matrix;
wherein the patterns of light emitted by the LED matrix are representative of vehicle headlights and/or vehicle taillights;
wherein the displayed video images are imaged by the vehicular camera through the mirror;
wherein the emitted patterns of light reflect off the mirror and are imaged by the vehicular camera; and
capturing image data with the vehicular camera, wherein the captured image data is representative of the displayed video images and the emitted patterns of light imaged by the vehicular camera.

20. The method of claim 19, comprising providing a computer, wherein the video control signals generated by the simulator control are received at the computer, and wherein the computer controls the display screen responsive to the received video control signals.

* * * * *